(12) United States Patent
Chen et al.

(10) Patent No.: US 11,239,241 B2
(45) Date of Patent: Feb. 1, 2022

(54) BIT LINE UTILIZED IN DRAM

(71) Applicants: UNITED MICROELECTRONICS CORP., Hsin-Chu (TW); Fujian Jinhua Integrated Circuit Co., Ltd., Quanzhou (CN)

(72) Inventors: Pin-Hong Chen, Tainan (TW); Yi-Wei Chen, Taichung (TW); Chih-Chieh Tsai, Kaohsiung (TW); Tzu-Chieh Chen, Pingtung County (TW); Tsun-Min Cheng, Changhua County (TW); Chi-Mao Hsu, Tainan (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 45 days.

(21) Appl. No.: 16/583,268

(22) Filed: Sep. 26, 2019

(65) Prior Publication Data

US 2020/0020698 A1    Jan. 16, 2020

Related U.S. Application Data

(62) Division of application No. 15/901,875, filed on Feb. 21, 2018, now Pat. No. 10,475,799.

(30) Foreign Application Priority Data

Feb. 1, 2018    (CN) .......................... 201810101479.6

(51) Int. Cl.
*H01L 27/108*    (2006.01)
*H01L 21/768*    (2006.01)

(52) U.S. Cl.
CPC .. *H01L 27/10885* (2013.01); *H01L 21/76841* (2013.01); *H01L 27/10814* (2013.01); *H01L 27/10823* (2013.01)

(58) Field of Classification Search
CPC ......... H01L 27/10885; H01L 21/76841; H01L 27/10823; H01L 27/10814; H01L 21/76885; H01L 21/7685; H01L 21/2855; H01L 23/528; H01L 24/43
See application file for complete search history.

(56) References Cited

U.S. PATENT DOCUMENTS

| | | | |
|---|---|---|---|
| 5,413,957 A | 5/1995 | Byun | |
| 5,427,666 A | 6/1995 | Mueller | |
| 5,849,634 A | 12/1998 | Iwata | |
| 6,413,858 B1 * | 7/2002 | Chopra | ............... H01L 21/2885 257/E21.175 |

(Continued)

FOREIGN PATENT DOCUMENTS

| | | |
|---|---|---|
| CN | 1375876 A | 10/2002 |
| CN | 1674215 A | 9/2005 |

*Primary Examiner* — Marcos D. Pizarro
*Assistant Examiner* — Sue Tang
(74) *Attorney, Agent, or Firm* — Winston Hsu

(57) ABSTRACT

A fabricating method of a semiconductive element includes providing a substrate, wherein an amorphous silicon layer covers the substrate. Then, a titanium nitride layer is provided to cover and contact the amorphous silicon layer. Later, a titanium layer is formed to cover the titanium nitride layer. Finally, a thermal process is performed to transform the titanium nitride layer into a nitrogen-containing titanium silicide layer.

6 Claims, 5 Drawing Sheets

(56) References Cited

U.S. PATENT DOCUMENTS

| | | |
|---|---|---|
| 2001/0021579 A1 | 9/2001 | Hu |
| 2002/0132426 A1 | 9/2002 | Shinohara |
| 2006/0261478 A1 | 11/2006 | Thei |
| 2012/0086084 A1 | 4/2012 | Kikuchi |
| 2016/0035676 A1* | 2/2016 | Im .................... H01L 23/53238 257/306 |

\* cited by examiner

# BIT LINE UTILIZED IN DRAM

CROSS REFERENCE TO RELATED APPLICATIONS

This patent application is a divisional application of and claims priority to U.S. patent application Ser. No. 15/901,875, filed on Feb. 21, 2018, and entitled "METHOD OF FABRICATING BIT LINE" the entire contents of which are incorporated herein by reference.

BACKGROUND OF THE INVENTION

1. Field of the Invention

The present invention relates to a fabricating method of a bit line, and more particularly to a method of using titanium nitride to prevent titanium atoms from diffusing into a conductive silicon.

2. Description of the Prior Art

Electrical products are becoming lighter, thinner, shorter, and smaller, and dynamic random access memories (DRAMs) are being scaled down to match the trends of high integration and high density. A DRAM comprising many memory cells is one of the most popular volatile memory devices utilized today. Each memory cell comprises a MOS transistor and at least a capacitor, wherein the MOS transistor and the capacitor form a series connection with each other. By using a word line and a bit line, a DRAM can be read and programmed.

A bit line usually includes a multiple conductive layers. However, during the fabricating steps of the bit line, metal atoms often diffuse from one layer to another. Theses diffusing metal atoms will cause current leakage afterwards.

SUMMARY OF THE INVENTION

In view of the above, it would be an advantage in the art to provide a fabricating method of a bit line which is not subject to current leakage.

According to a preferred embodiment of the present invention, a bit line utilized in a DRAM, includes a conductive silicon layer. A nitrogen-containing titanium silicide/titanium silicide layer contacts the conductive silicon layer. A conductive layer covers the nitrogen-containing titanium silicide/titanium silicide layer.

According to another preferred embodiment of the present invention, a fabricating method of a semiconductive element includes providing a substrate, wherein an amorphous silicon layer covers the substrate. Then, a titanium nitride layer is provided to cover and contact the amorphous silicon layer. Later, a titanium layer is formed to cover the titanium nitride layer. Finally, a thermal process is performed to transform the titanium nitride layer into a nitrogen-containing titanium silicide layer.

According to another preferred embodiment of the present invention, a fabricating method of a bit line includes providing a chamber, wherein the chamber comprises a titanium target disposed on a top wall of the chamber and a stage disposed on a bottom of the chamber. Then, a burn-in process is performed. The burn-in process includes introducing nitrogen gas and inert gas into the chamber, and ionizing the nitrogen gas and the inert gas to form nitrogen ions and inert ions. The nitrogen ions and inert ions bombard the titanium target to form a first titanium nitride layer on the top wall and the bottom of the chamber. After the burn-in process, a substrate is provided on the stage, wherein a conductive silicon layer covers the substrate. After providing the substrate on the stage, a deposition process is performed. The deposition process includes introducing inert gas into the chamber, and ionizing the inert gas to form inert ions. Then, the first titanium nitride layer is bombarded by inert ions to form a second titanium nitride layer to contact the conductive silicon layer. After forming the second titanium nitride layer, the inert ions bombard the titanium target to deposit a titanium layer to cover the second titanium nitride layer. Next, a conductive layer is formed to cover the titanium layer. Finally, a thermal process is performed to react both the second titanium nitride layer and the titanium layer with the conductive silicon layer to form a nitrogen-containing titanium silicide/titanium silicide layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 depict a fabricating method of a bit line according a first preferred embodiment of the present invention, wherein:

FIG. 1 shows a chamber with a stage inside:
FIG. 2 is a fabricating stage following FIG. 1;
FIG. 3 is a fabricating stage following FIG. 2;
FIG. 4 is a fabricating stage following FIG. 3;
FIG. 5 is a fabricating stage following FIG. 4;
and
FIG. 6 is a fabricating stage following FIG. 5.

DETAILED DESCRIPTION

Figure 1:
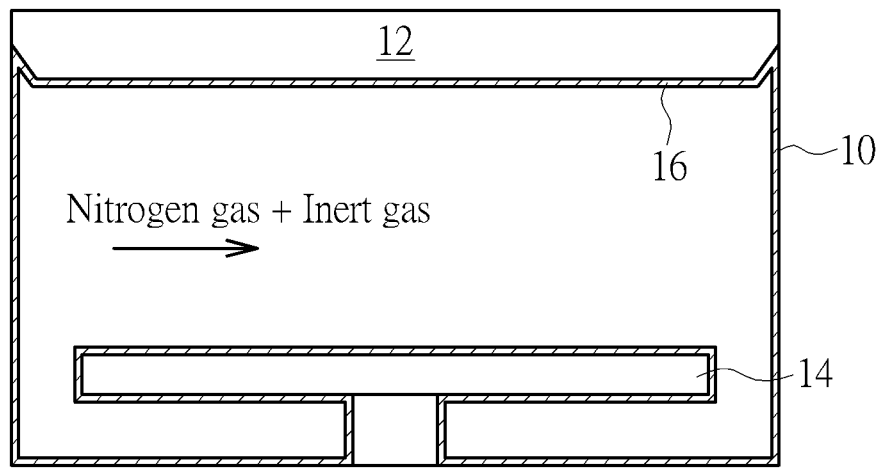
Figure 5:
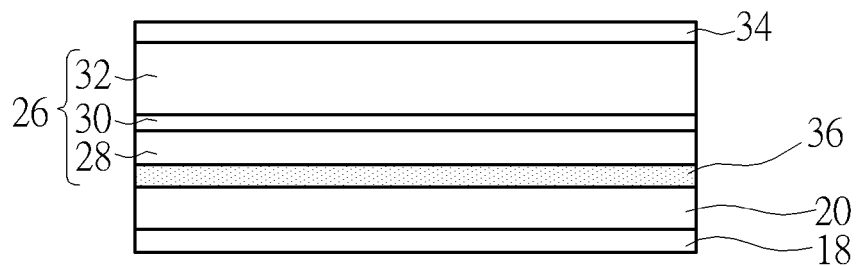
Figure 6:
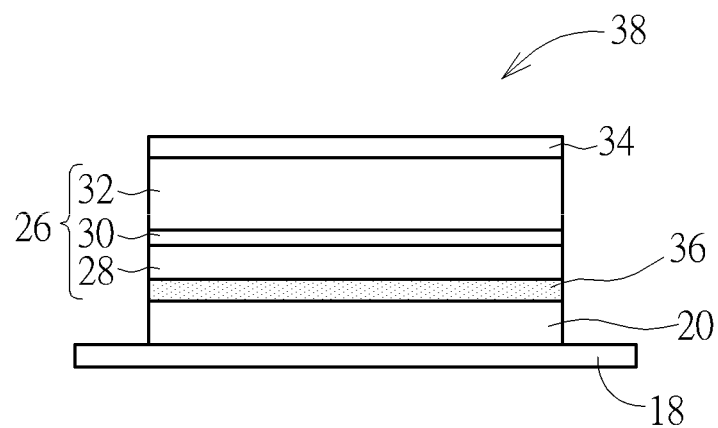
Figure 7:
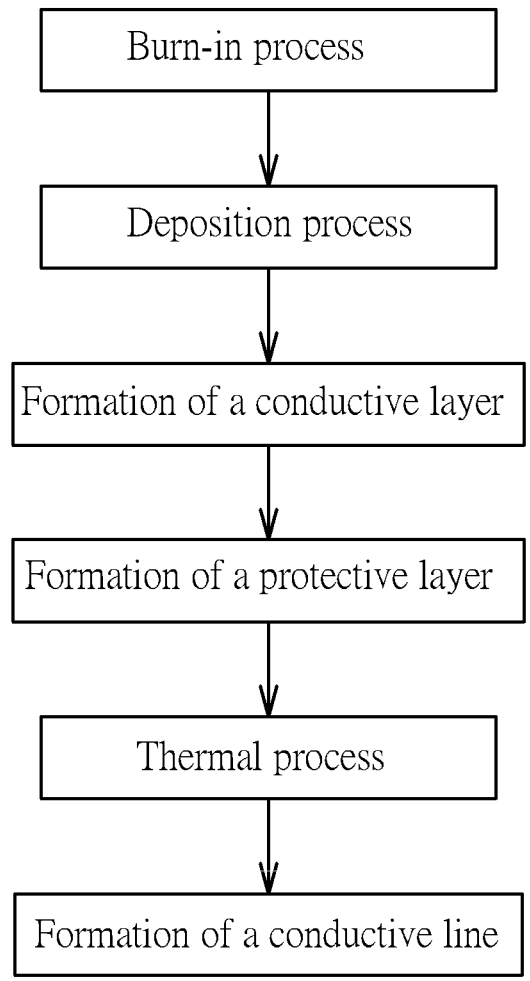
FIG. 7 depicts a flow chart of a fabricating method of a bit line in a first preferred embodiment of the present invention.

FIG. 1 to FIG. 6 depict a fabricating method of a bit line according to a first preferred embodiment of the present invention. FIG. 7 depicts a flow chart of a fabricating method of a bit line of the present invention. As shown in FIG. 1, a chamber 10 is provided. A titanium target 12 is disposed on a top wall of the chamber 10. A stage 14 is disposed on a bottom of the chamber 10. As shown in FIG. 1 and FIG. 7, a burn-in process is performed. The burn-in process includes introducing nitrogen gas and inert gas into the chamber 10. Then, the nitrogen gas and the inert gas are ionized to form nitrogen ions and inert ions. Later, the inert ions bombard the titanium target 12 to form titanium ions, and the some nitrogen ions combine with the titanium ions to form a first titanium nitride layer 16. Some of the nitrogen ions also bombard the titanium target 12 to ionize the titanium target 12, and the titanium ions bombarded by nitrogen ions combine with the nitrogen ions to form the first titanium nitride layer 16 as well. The first titanium nitride layer 16 is formed on the top wall, the bottom, a sidewall of the chamber 10 and on the titanium target 12. According to a preferred embodiment of the present invention, the inert gas is preferably argon. The inert ions are preferably argon ions. Furthermore, during the burn-in process, a flow rate of the nitrogen gas is between 80 and 120 standard-state cubic centimeter per minute (sccm), and a duration of introducing the nitrogen gas is 30 seconds. It is noteworthy that during the burn-in process, there is not any substrate in the chamber. Therefore, the first titanium nitride layer 16 is also deposited on the surface of the stage 14. According to another preferred embodiment, a dummy wafer may be disposed on the stage 14 during the burn-in process to prevent the first titanium nitride 16 from depositing on the surface of the stage 14.

Figure 2:
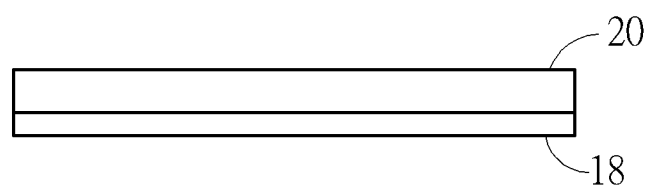

As shown in FIG. 2, a substrate 18 is provided. Then, a conductive silicon layer 20 is formed to contact the substrate 10. The conductive silicon layer 20 is preferably amorphous silicon. The thickness of the conductive silicon layer 20 is preferably between 270 and 330 angstroms. The substrate 18 may be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. Before forming a conductive silicon layer 20 on the substrate 18, several devices such as buried word lines or isolations can be formed in the substrate 18.

Figure 3:
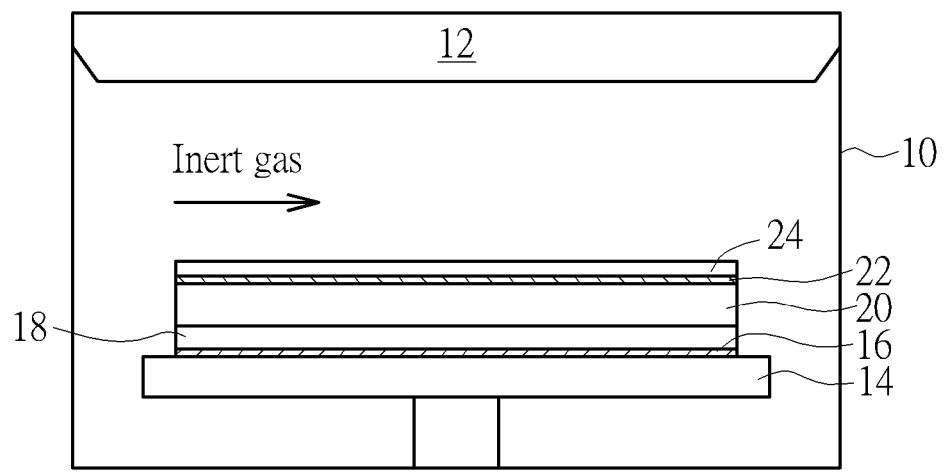

As shown in FIG. 3 and FIG. 7, after the burn-in process, the substrate 18 is disposed on the stage 14 in the chamber 10. The substrate 18 covers the first titanium nitride layer 16 on the stage 14. After disposing the substrate 18 in the chamber 10, a deposition process is performed. During the deposition process inert gas is introduced into the chamber, and the inert gas ionized to form inert ions. During the deposition process, there is no nitrogen gas introduced into the chamber 10.

Please refer to FIG. 1 and FIG. 3. During the deposition process, the inert ions bombard the first titanium nitride layer 16 on the titanium target 12 and on the top wall, the side wall, and the bottom of the chamber 10 to form titanium ions and nitrogen ions. Then, titanium ions combine with nitrogen ions to form a second titanium nitride layer 22 deposited on and contacting the conductive silicon layer 20. While forming the second titanium nitride layer 22, the first titanium nitride layer 16 is consumed gradually. After the first titanium nitride layer 16 consumed entirely, the titanium target 12 is exposed. Later, the inert ions start to bombard the titanium target 12 to ionize the titanium target 12 into titanium ions. Then, the titanium ions are deposited to form a titanium layer 24 and contact the second titanium nitride layer 22. When the titanium layer 24 reach a pre-determined thickness, the deposition process is stopped. The pre-determined thickness of the titanium layer 24 is between 20 and 30 angstroms. A ratio of number of nitrogen atoms in the second titanium nitride layer 22 to number of titanium atoms in the second titanium nitride layer 22 is between 0.9 and 1.1. A ratio of a thickness of the second titanium nitride layer 22 to a thickness of the titanium layer 24 is smaller than one third. The second titanium nitride layer 22 includes a first nitrogen concentration, the first nitrogen concentration changes in gradient, and the first nitrogen concentration decreases in a direction from the conductive silicon layer 20 to the titanium layer 24. That is, the first nitrogen concentration in the second titanium nitride layer 22 near the titanium layer 24 is smaller. The first nitrogen concentration in the second titanium nitride layer 22 near the conductive silicon layer 20 is larger. It is important that the second titanium nitride layer 22 is disposed between the titanium layer 24 and the conductive silicon layer 20. The second titanium nitride layer 22 can stop the titanium atoms diffuse into the conductive silicon layer 20 in a thermal process performed later.

Figure 4:
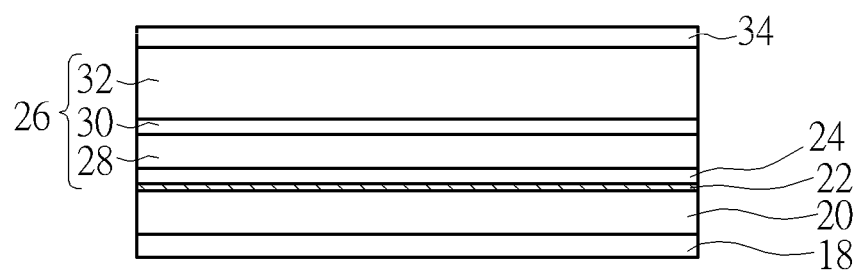

As shown in FIG. 4 and FIG. 7, a conductive layer 26 is formed to cover the titanium layer 24. The conductive layer 26 preferably includes a third titanium nitride layer 28, a metal silicide layer 30 and a metal layer 32 stacked from bottom to top. The third titanium nitride layer 28 may be formed in the chamber 10 after forming the titanium layer 24. The third titanium nitride layer 28 can be formed by introducing nitrogen gas and inert gas into the chamber 10, and formed by the same method as that of the second titanium nitride layer 22. Later, the substrate 18 is moved out of the chamber 10. Subsequently, the metal silicide layer 30 and the metal layer 32 are formed. The metal silicide layer 30 is preferably tungsten silicide, and the metal layer 32 is preferably tungsten.

According to another preferred embodiment of the present invention, after forming the titanium layer 24, the substrate 18 is moved out of the chamber 10 and sent into another chamber (not shown). In another chamber, the third titanium nitride layer 28 can be formed by a physical vapor deposition, a chemical vapor deposition or other suitable methods. If the third titanium nitride layer 28 is formed in the chamber 10, another substrate which is sent in the chamber 10 after moving out the substrate 18, does not need the burn-in process. Because during forming the third titanium nitride layer 28, another titanium nitride layer is formed on the sidewalls, the top wall, the bottom of the chamber 10, and the titanium target 12. In this way, the substrate which is sent in the chamber 10 after the substrate 18 can skip the burn-in process, and get into the deposition process directly.

After forming the conductive layer 26, a protective layer 34 is formed to cover the conductive layer 26. The protective layer is preferably silicon nitride. As shown in FIG. 5 and FIG. 7, a thermal process is performed to react the second titanium nitride layer 22 with the conductive silicon layer 20 and transform the second titanium nitride layer 22 into a nitrogen-containing titanium silicide layer. In the same time, the titanium layer 24 reacts with the conductive layer 20 to transform the titanium layer 24 into a titanium silicide layer. The nitrogen-containing titanium silicide layer and the titanium silicide layer form a mixture. This mixture is called a nitrogen-containing titanium silicide layer/titanium silicide layer 36. In the nitrogen-containing titanium silicide layer/titanium silicide layer 36, the titanium silicide layer surrounds the nitrogen-containing titanium silicide layer. Because the titanium silicide layer and the nitrogen-containing titanium silicide layer in the nitrogen-containing titanium silicide layer/titanium silicide layer 36 mix together, they both contact the conductive layer 20. Furthermore, the titanium silicide layer and the nitrogen-containing titanium silicide layer contact each other. In addition, the nitrogen-containing titanium silicide layer has a second nitrogen concentration, the second nitrogen concentration changes in gradient, and the second nitrogen concentration decreases in a direction away from the conductive silicon layer 20. That is, the second nitrogen concentration is higher in the nitrogen-containing titanium silicide layer near the conductive silicon layer 20, the second nitrogen concentration is lower in the nitrogen-containing titanium silicide layer far away from the conductive silicon layer 20. As shown in FIG. 6 and FIG. 7, the conductive layer 20, the nitrogen-containing titanium silicide layer/titanium silicide layer 36, and the conductive silicon layer 20 are patterned to form a conductive line, such as a bit line 38. The bit line 38 is preferably used in a dynamic random access memory (DRAM).

Figure 8:
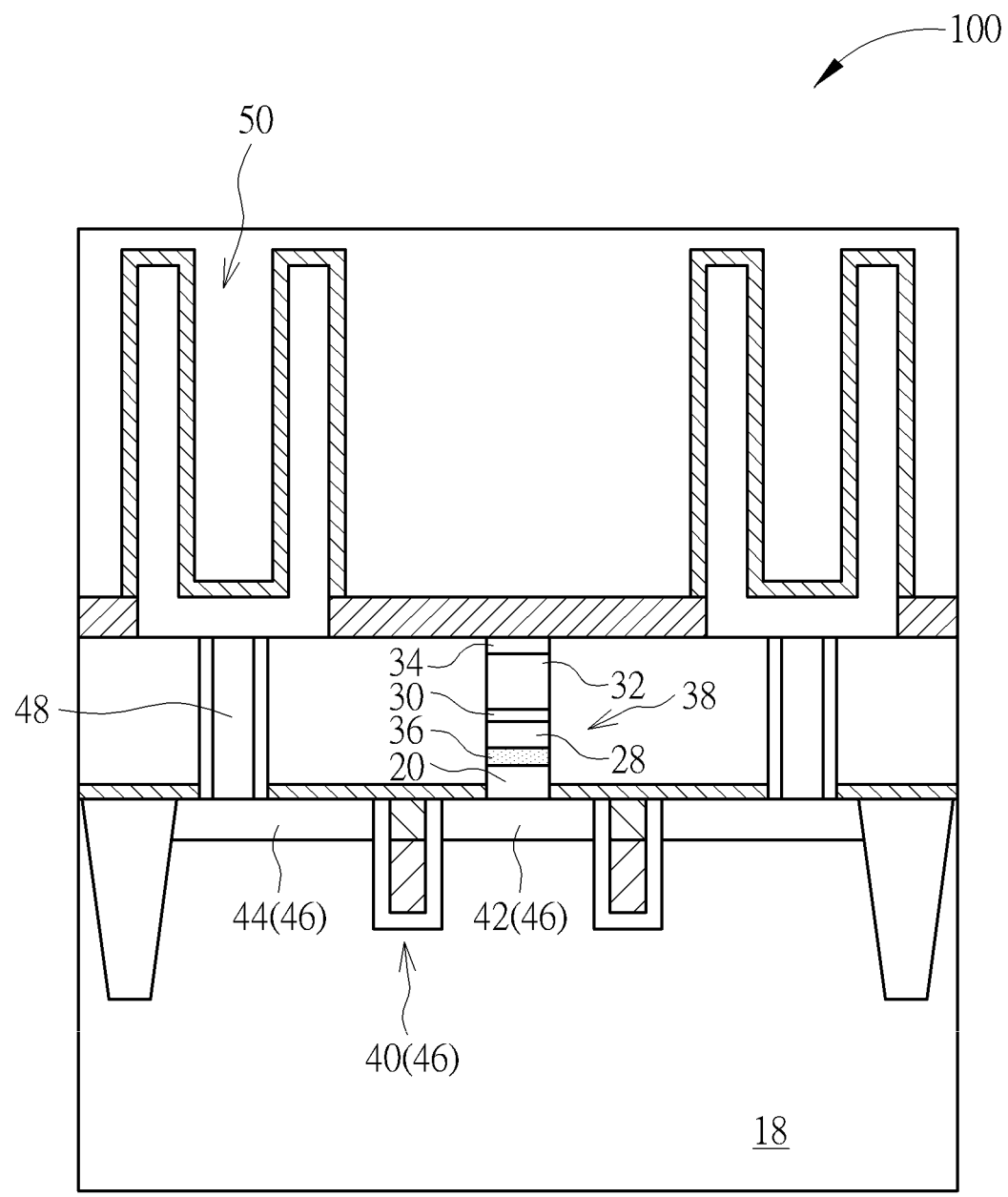
FIG. 8 depicts a DRAM according to a second preferred embodiment of the present invention.

FIG. 8 depicts a DRAM according to a second preferred embodiment of the present invention, wherein elements which are substantially the same as those in the first preferred embodiment denoted by the same reference numerals; an accompanying explanation is therefore omitted. As shown in FIG. 8, a buried gate 40 is disposed in the substrate 18. A source doping region 42 and a drain doping region 44 are respectively disposed at two sides of the buried gate 40. The buried gate 40, the source doping region 42 and the drain doping region 44 form a buried transistor 46. A bit line 38 electrically connects to the buried transistor 46 through the source doping region 42. The drain doping region 44 electrically connects to a contact plug 48. The contact plug 48 electrically connects to a capacitor 50. Therefore, the buried transistor 46 electrically connects to the capacitor 50. A DRAM is formed by the buried transistor 46 and the capacitor 50. Besides, the bit line 38 includes a conductive silicon layer 20, a nitrogen-containing titanium silicide/titanium silicide layer 36 and a conductive layer 26. The nitrogen-containing titanium silicide/titanium silicide layer 36 contacts the conductive silicon layer 20. The conductive layer 26 covers the nitrogen-containing titanium silicide/titanium silicide layer 36. The nitrogen-containing titanium silicide/titanium silicide layer 36 is a mixture of a nitrogen-containing titanium silicide layer and a titanium silicide layer. The conductive layer 26 includes a third titanium nitride layer 28, a metal silicide layer 30 and a metal layer 32. A protective layer 34 covers the conductive layer 26. The protective layer 34 may be silicon nitride.

In the fabricating method of a bit line in the present invention, a titanium nitride layer is specially disposed between the conductive silicon layer and the titanium layer. In this way, the titanium nitride layer can prevent the titanium layer from diffusing into the conductive silicon layer during the thermal process. If the titanium layer diffuses into the conductive silicon layer, the titanium layer in the conductive silicon layer will be etched to form numerous holes while patterning the conductive layer 20, the nitrogen-containing titanium silicide layer/titanium silicide layer 36, and the conductive silicon layer 20. These holes in the conductive silicon layer lead to current leakage. By using the method of the present invention, the current leakage is prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bit line utilized in a DRAM, comprising:
    a conductive silicon layer;
    a nitrogen-containing titanium silicide/titanium silicide mixture contacting the conductive silicon layer, wherein the nitrogen-containing titanium silicide/titanium silicide mixture comprises nitrogen-containing titanium silicide and titanium silicide, and the nitrogen-containing titanium silicide layer comprises a nitrogen concentration, the nitrogen concentration changes in gradient, and the nitrogen concentration decreases in a direction away from the conductive silicon layer; and
    a conductive layer covering the nitrogen-containing titanium silicide/titanium silicide mixture, wherein the conductive layer comprises a titanium nitride, a metal silicide and a metal layer.

2. The bit line utilized in a DRAM of claim 1, further comprising:
    a transistor electrically connecting to and contacting the bit line;
    a contact plug electrically connecting to the transistor; and
    a capacitor electrically connecting to the contact plug.

3. The bit line utilized in a DRAM of claim 2, wherein the transistor comprises:
    a buried gate;
    a source doping region disposed at one side of the buried gate; and
    a drain doping region disposed at another side of the buried gate.

4. The bit line utilized in a DRAM of claim 1, wherein the metal silicide is tungsten silicide and the metal layer is a tungsten layer.

5. The bit line utilized in a DRAM of claim 1, wherein the nitrogen-containing titanium silicide and the titanium silicide both contact the conductive silicon layer.

6. The bit line utilized in a DRAM of claim 1, further comprising:
    a protective layer covering the conductive layer.

* * * * *